United States Patent [19]
Ohashi

[11] Patent Number: 4,985,728
[45] Date of Patent: Jan. 15, 1991

[54] EXPOSURE METHOD FOR FORMING LATENT IMAGES

[75] Inventor: Kunio Ohashi, Nara, Japan

[73] Assignee: Sharp Kabushiki Kaisha, Osaka, Japan

[21] Appl. No.: 413,218

[22] Filed: Sep. 27, 1989

[30] Foreign Application Priority Data

Sep. 29, 1988 [JP] Japan ................................ 63-244970

[51] Int. Cl.$^5$ .............................................. G03B 27/62
[52] U.S. Cl. ......................................... 355/77; 355/27; 430/138
[58] Field of Search ............................ 355/27, 28, 77; 430/138

[56] References Cited

U.S. PATENT DOCUMENTS 4,399,209 8/1983 Sanders et al. ...................... 430/138
4,794,425 12/1988 Sakai et al. ............................ 355/27

Primary Examiner—L. T. Hix
Assistant Examiner—Khanh Dang

[57] ABSTRACT

A method for forming latent images on a media sheet coated with micro-capsules. Each of the microcapsules contains a dye capable of coloring to either yellow, magenta or cyan and is curable by irradiating to one of blue, green and red light. The media sheet is successively exposed to blue, green and red light to cure the micro-capsules. There is an interval of at least 5 seconds between exposure times of the blue, green and red lights.

6 Claims, 8 Drawing Sheets

|   | Liquid crystal 24a: Yellow | Liquid crystal 24b: Magenta | Liquid crystal 24c: Cyan |
|---|---|---|---|
| 1 | No picture image | No picture image | Step wedge image |
| 2 | No picture image | Step wedge image | No picture image |
| 3 | Step wedge image | No picture image | No picture image |
| 4 | Step wedge image | Step wedge image | Step wedge image |

EXPOSURE METHOD FOR FORMING LATENT IMAGES

FIELD OF THE INVENTION

The present invention relates to an improvement in methods for forming color image.

BACKGROUND OF THE INVENTION

There has been proposed an exposure method which uses a photosensitive media sheet having a pressure-sensitive property, an image receiving sheet, and forms picture images on the image receiving sheet, as disclosed in the Japanese Patent Publication (Unexamined) No. 88739/1983. Further, the Japanese Patent Publication (Unexamined) No. 30537/1984 discloses a media sheet corresponding to all kinds of colors, in which the film is coated with three kinds of micro-capsules. The three kinds of micro-capsules are: (1) a Y micro-capsule containing a photo-curable ingredient sensitive to light within a blue wavelength range, and a colorless dye capable of coloring to yellow, (2) an M micro-capsules containing a photo-curable ingredient sensitive to light within a green wavelength range, and a colorless dye capable of coloring to magenta, and (3) a C micro-capsule containing a photo-curable ingredient sensitive to light within a red wavelength range, and a colorless dye capable of coloring to cyan.

Each of these micro-capsules is cured by exposing the micro-capsules to light within its sensitive wavelength range. After the exposure, the media sheet and an image receiving sheet are overlapped at their active surfaces under pressure, and hence, the uncured micro-capsules are crushed to reproduce picture images colored in all kinds of colors on the image receiving sheet.

There are two methods for exposing a media sheet corresponding to all kinds of colors to form latent images. One is to simultaneously expose the media sheet to light within a wavelength range of approximately 400 to 700 nm which includes blue, green, and red wavelength ranges. The other is to successively expose the media sheet to light within a wavelength range of approximately 400 to 500 nm which corresponds to a blue wavelength range, to light within a wavelength range of approximately 500 to 600 nm which corresponds to a green wavelength, and to light within a wavelength range of approximately 600 to 700 nm which corresponds to a red wavelength range, in accordance with the respective sensitivities of the Y, M, and C microcapsules.

In the successive exposure method, several pieces of digital picture image information, which correspond to yellow, magenta, and cyan, are previously written on three liquid crystals respectively. The media sheet is exposed only to light within the blue wavelength range separated from the light transmitted through the liquid crystal to which the yellow picture image information has been written, next, to light separated from the light transmitted through the liquid crystal to which the magenta picture image information has been written, and to light separated from the light transmitted through the liquid crystal to which the cyan picture image information has been written. Through these exposure, the Y, M, and C micro-capsules are cured to form latent images according to the digitized picture image information of all kinds of colors.

It is to be noted that this three-stepped exposure method has a drawback which results in deterioration in the color densities of three primary colors of yellow, magenta, and cyan. In addition, there is a severe difference in the characteristic curve between the reproduced color of each primary color and the reproduced color of a neutral grey. For these drawbacks, the conventional digital picture image processing technique can not reproduce color accurately, and requires a complicated light source controlling to obtain an accurate reproduced color.

SUMMARY OF THE INVENTION

The object of the present invention is to provide a method for forming latent images on a media sheet coated with micro-capsules, each of which contains a dye capable of coloring to either yellow, magenta or cyan and is cured by irradiating to one of blue, green and red light, characterized by successively exposing said media sheet to blue, green and red light at an interval of at least 0.5 seconds.

DETAILED DESCRIPTION OF THE INVENTION

Figure 2:
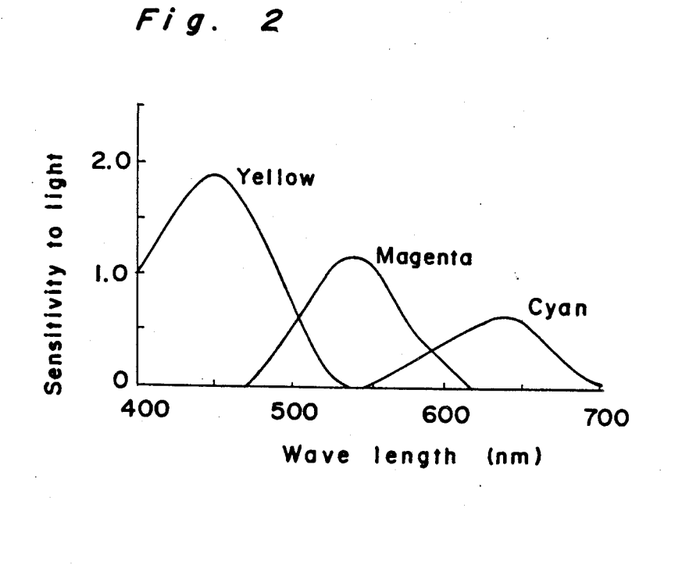
FIG. 2 is a graph for showing the spectral and sensitivity characteristics of three kinds of micro-capsules on the media sheet.
Figure 3:
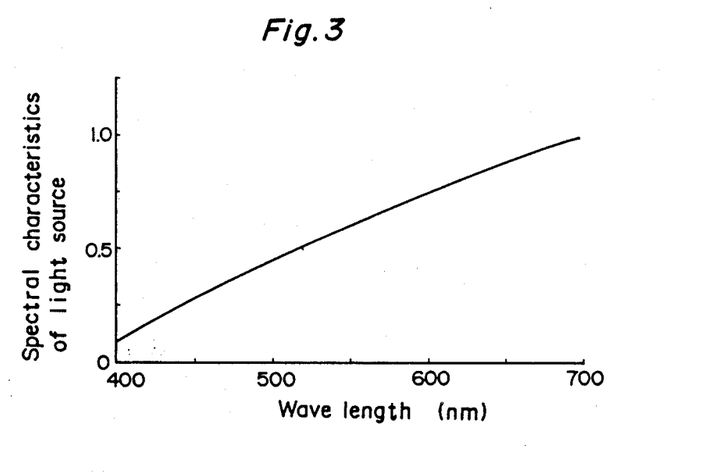
FIG. 3 is a graph for showing the spectral characteristics of the light source used.
Figure 4:
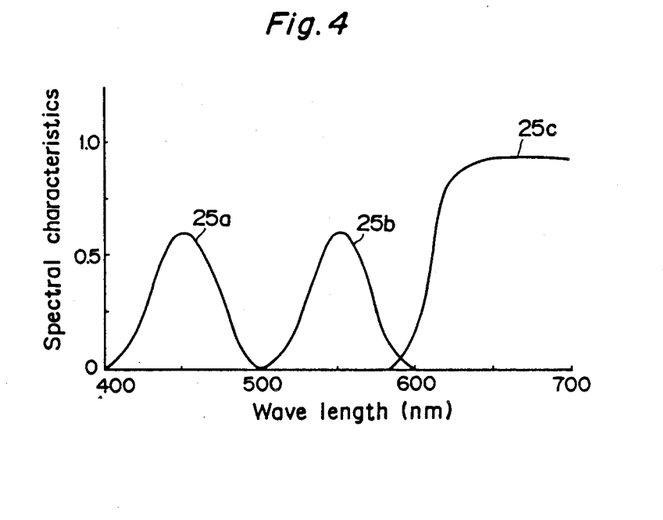
FIG. 4 is a graph for showing the characteristics of the filter used for color separation, which is employed in the optical system for exposure.

FIG. 2 shows the respective sensitivities of the Y, M, and C micro-capsules to light within the shown wavelength ranges. FIG. 3 shows the spectral characteristics of a light source, and FIG. 4 shows an example of the spectral characteristics of a filter which color-separates the exposure light to the media sheet. By using these light source and filter, the respective apparent sensitivities of the Y, M, and C micro-capsules can be approximately flat.

As apparent from FIG. 2, the respective light wavelength ranges to which the Y, M, and C micro-capsules are sensitive are partially overlapped to each other (the overlapped portion is hereinafter referred to as a cross talk), so that disadvantageously each micro-capsule is sensitive to light within a wavelength range other than its own sensitivity range, and cured. For example, the Y micro-capsule is sensitive not only to light within a wavelength range of approximately 400 to 500 nm for a blue color, but also to light within a wavelength range of approximately 500 to 600 nm for a green color. For this reason, the respective micro-capsules are unnecessarily cured through three times exposure, which leads to the deterioration in the reproduced color density. The particular reason which deteriorates the densities of the three primary colors is that yellow, for example, is large in the amount of light within the green wavelength range because of the absence of the corresponding image, so that the micro-capsules are cured unnecessarily due to the cross talk ranges.

The photo-setting material which cures the micro-capsules is generally radical-polymerized by exposure to light, and cured. The radicals are easily combined with oxygen, and the oxygen prevents the photo-curable material from being cured. This means that if the micro-capsules contain oxygen, it can restrain the curing of the micro-capsules when they are excessively cured. It is to be noted that the surface of the micro-capsule is formed of resin shell, which permits oxygen to permeate into the micro-capsule. Accordingly, if there are time intervals between each of exposures for supplying oxygen to the micro-capsule, it will prevent the micro-capsule from being cured, and also solve the problem of the color density deterioration.

According to the tests conducted by the present inventors, if the interval between each of exposures is set to 0.5 sec. or more, sufficient oxygen supply can be accomplished even when reproducing a primary color such as yellow, magenta, and cyan, and prevent the micro-capsules from being excessively cured. The interval between each exposure is obtained by either ceasing or stopping the exposure of one wave length and thereafter starting the exposure of the next wave length.

EXAMPLE

Figure 6:
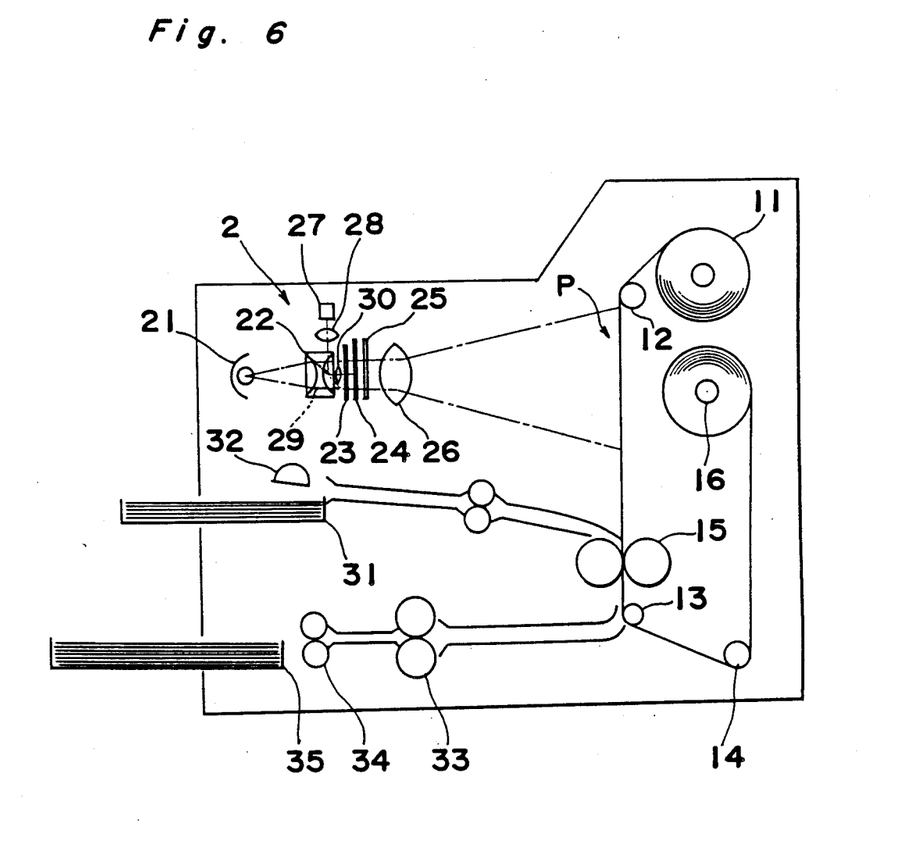
FIG. 6 is a schematic front view of the picture image forming apparatus used for the tests.

FIG. 6 is a schematic front view of an image forming apparatus which adopts the exposure method according to the present invention.

Referring to FIG. 6, a numeral 11 is a media sheet which is rolled around a spool, and taken up onto a take-up spool 16 through guide rolls 12, 13, and 14, and a pair of pressure rolls 15. The media sheet 11 is exposed to light at the exposing portion P so that latent images can be formed thereon. An optical system 2 is provided confronting the exposing portion P, and includes a light source 21 having the spectral characteristics as shown in FIG. 3. Light emitted from the light source 21 irradiates the exposing portion P through a condenser lens 22, a liquid panel 24, a filter 25, and an image forming lens 26. Picture image information is written to the liquid crystal panel 24 by means of a laser diode 27, and the transmitted light from the liquid crystal 24 irradiates the media sheet. A numeral 23 is a shutter which is opened or closed as required.

Figure 7:
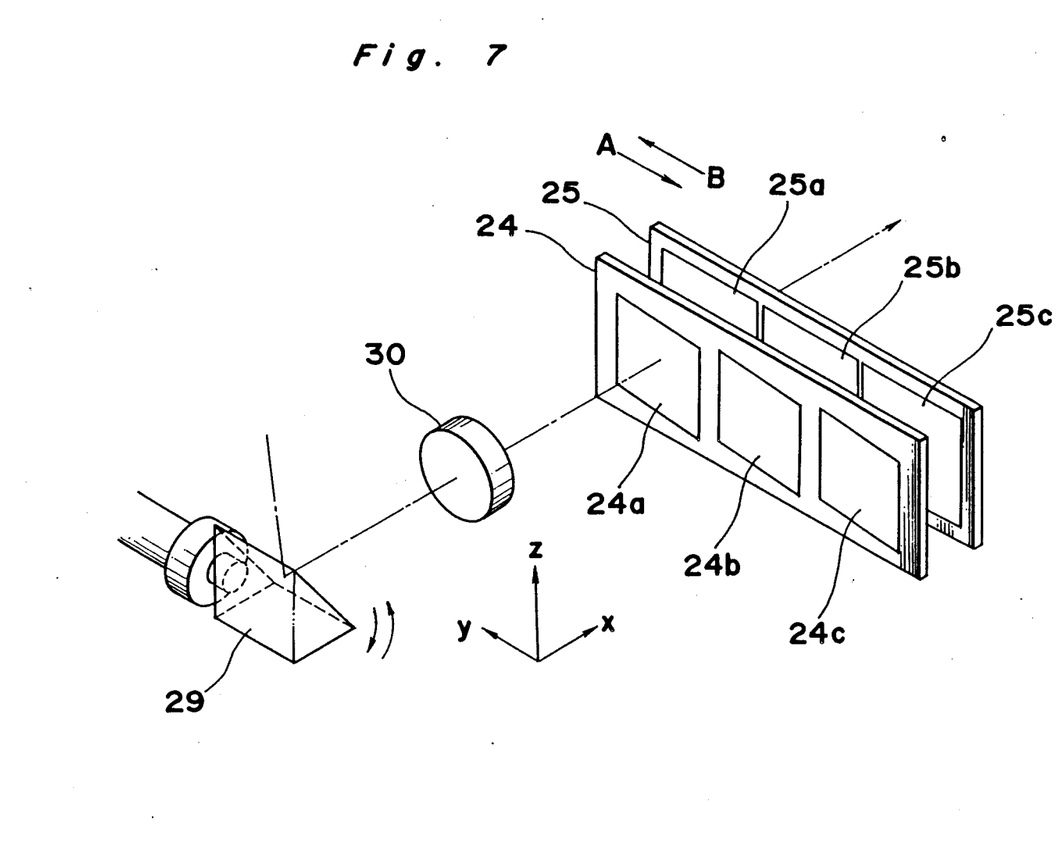
FIG. 7 is an enlarged perspective view of the optical system.

FIG. 7 is an enlarged partial perspective view of the optical system 2.

Referring to FIG. 7, the liquid crystal panel 24 is composed of liquid crystals 24a, 24b, and 24c. Three pieces of picture image information of yellow, magenta, and cyan are written to the liquid crystals 24a, 24b, and 24c. The filter 25 is also composed of filters 25a, 25b, and 25c, which have the transmission characteristics as shown in FIG. 4. The liquid crystal panel 24 and the filter 25 are supported by a base (not shown) in a cooperative relationship, and precisely controlled to move toward the arrow direction A or B by a linear motor or linear encoder.

The laser diode 27 emits a laser beam to write, to the liquid crystal, the digitized picture image information inputted by a computer or scanner. This laser beam forms an image on the liquid crystal panel 24 through a collimater lens 28, a galvano mirror 29, and the image forming lens 30. The digitized picture image information consists of three pieces of information of three primary colors, i.e., yellow, magenta, and cyan. When each primary color image is projected as a laser beam, the liquid crystal panel 24 is moved toward the arrow direction A or B so as to write the picture image information to a predetermined liquid crystal 24a, 24b, or 24c: the yellow picture image information is written to the liquid crystal 24a, the magenta picture image information to the liquid crystal 24b, and the cyan picture image information to the liquid crystal 24c. In addition, when picture image information is written to the liquid crystal panel 24 by the laser diode 27, a laser beam scanning operation along the y direction is carried out with the movement of the liquid crystal panel 24 toward the arrow direction A or B, and a laser beam scanning operation along the z direction is carried out with the rotation of the galvano mirror 29.

The liquid crystals 24a, 24b, and 24c to which the respective pieces of picture image information have been written are exposed to light from the light source 21, and the light transmitted through one of them irradiates the media sheet. Exposure is carried out, with interposing, first the liquid crystal 24a, second the liquid crystal 24b, and third the liquid crystal 24c on the optical path between the light source 21 and the media sheet. Simultaneously with the movements of the liquid crystals, the filter 25 is moved: the liquid crystal 24a moves together with the filter 25a to transmit light within a blue wavelength range, the liquid crystal 24b together with the filter 25a to transmit light within a green wavelength range, and the liquid crystal 24c together with the filter 25c to transmit light within a red wavelength range. Through these three-stepped exposures, three kinds of micro-capsules are respectively cured on the media sheet, thereby forming latent images.

Image receiving sheets are stored in the cassette provided on the left side wall of the body of the image forming apparatus. An image receiving sheet is fed by the rotation of the supply roll 32, and overlapped on the media sheet storing the latent images at the pressure rolls 15. The both sheets are pressed by the pressure rolls 15 to crush the uncured micro-capsules, so that the colorless dye flows from the crushed micro-capsules to reproduce colored picture images on the image receiving sheet. The image receiving sheet is delivered to the tray 35 through the heat rolls 33, and the delivery rolls 34. The coloring reaction of this image receiving sheet is accelerated by heat of the heat rolls 33, thereby improving the color densities of the reproduced picture image.

Figure 5:
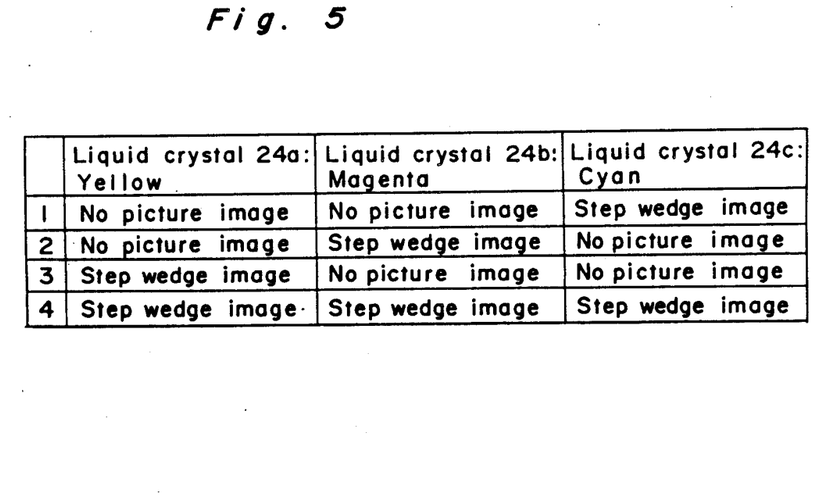
FIG. 5 is a table for showing the picture image information written to the liquid crystal panel used for the tests.

With the use of the image forming apparatus as constructed above, the image forming performance is tested. The table in FIG. 5 shows the respective picture image information written to the liquid crystals 24a, 24b, and 24c. The step wedge image stated in the table is defined as an image which is formed by varying the transmission density per a given area from 0.1 to 1.8.

When latent images are formed on the conditions '1' of the table, light transmits through the liquid crystal 24a and the filter 25a, and irradiates a media sheet 11. Then, after a predetermined time has passed, light transmits through the liquid crystal 24b and the filter 25b, and irradiates the media sheet 11. Further, after the predetermined time has passed, light transmits through the liquid crystal 24c and the filter 25c, and irradiates the media sheet 11. Through the three stepped exposures, latent images are formed on the media sheet 11. In this latent image forming process, since picture image information, i.e. step wedge images have not been written to the liquid crystals 24a and 24b, the amount of light transmitting therethrough is large, so that the Y and the M micro-capsules are entirely cured. As a result, the formed picture images are of cyan color.

In the same manners of the conditions '1', magenta colored picture images can be obtained on the conditions '2'; yellow colored picture images can be obtained on the conditions '3'; and neutral grey colored picture images can be obtained on the conditions '4'.

The respective colored picture images are formed on the conditions '1' to '4', with setting the time to 0.7 sec., 0.5 sec., 0.4 sec., and 0.2 sec., respectively. FIGS. 1(A) to 1(D) are graphs which show the results of the above mentioned tests conducted by employing the respective time between exposures. In the graphs, the respective axes of abscissa represent the densities of the step wedge images written to the liquid crystals, and the respective axes of ordinate represent the densities of the formed picture images, and also the densities of the respective picture images formed on the conditions '1' to '4' shown in the table in FIG. 5.

As apparent from these graphs, when the time between exposures is set to 0.4 sec., and to 0.2 sec., the characteristic curves of the plain colors of cyan, yellow, and magenta are lower in the maximal densities, and smaller in the gradients (gamma), than the characteristic curve of grey. This tendency is particularly remarkable in magenta. This is why the M capsules capable of coloring to magenta are sensitive not only to light within the green wavelength range, but to light within the blue and the red wavelength ranges, and cured. If the time between is insufficient, the amount of oxygen supplied to the micro-capsules becomes short, so that the M micro-capsules are cured. In this case, namely, when picture images are formed on the conditions '2', the respective pieces of picture image information have not been written to the liquid crystals 24a, and 24c at the exposures for yellow, and cyan picture images, so that the amount of light, as a whole, are large, and that the oxygen consuming amount is increased in the M micro-capsules. For this, oxygen can not be sufficiently supplied- to the M micro-capsules in such a short time between exposures as 0.4 sec., or 0.2 sec., which leads to the excessive cure of the micro-capsules. In the meantime, at the time for magenta picture images, the step wedge images have been written to the liquid crystal 24b, so that the light amount, as a whole, is small. Accordingly, the oxygen in the Y and the C micro-capsules are not consumed so much, and the oxygen can be saturated in the amount in a time of 0.4 sec., or 0.2 sec. in the micro-capsules. However, since the light amount is large at the exposure time for yellow and magenta picture images, the Y micro-capsules and the C micro-capsules are almost completely cured.

Figure 1:
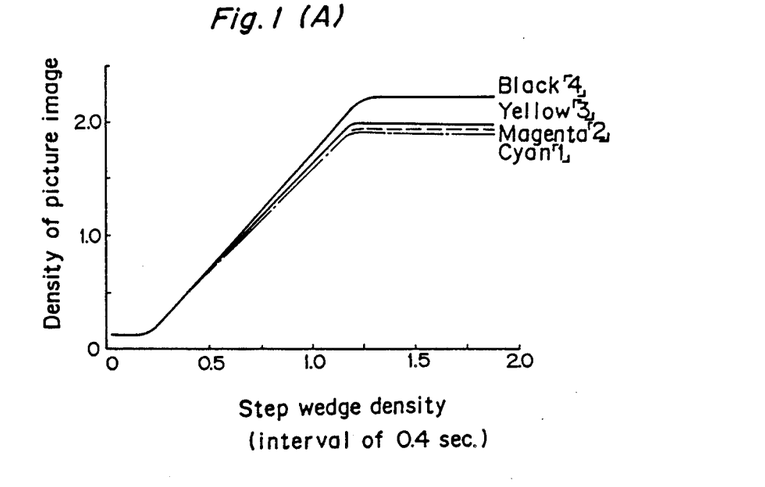
FIGS. 1(A), 1(B), 1(C) and 1(D) are graphs for showing the respective relationships between the exposure time and the reproduced picture images, in which the respective exposure time are set variably.

In contrast, referring to, FIGS. 1(A) and 1(B), when the time between exposures is set to 0.5 sec., and to 0.7 sec., the respective characteristic curves are close to the characteristic curve of grey. Accordingly, the apparent picture images reach a satisfactory level. This is because when the time between exposures is set to 0.5 sec., or more, oxygen can be supplied to the micro-capsules for the 0.5 sec or more, which prevents the micro-capsules from being excessively cured. This effect can prevent the deterioration in the picture image densities of the primary colors of yellow, magenta, and cyan.

As has been understood from the above descriptions, the present invention can advantageously prevent the deterioration in the densities of the primary colors of yellow, magenta, and cyan of the reproduced picture images. Moreover, in the present invention, the characteristic curves of the reproduced primary colors can be close to the characteristic curve of grey, so that accurate color reproduction can be accomplished by the simple digitized picture image technique without any complicated exposure controlling or the like.

What is claimed is:

1. A method for forming latent images on a media sheet which is coated with at least first micro-capsules which contain a first photocurable material, which is curable by light having a first wave length range, and a first color developing dye, and second micro-capsules which contain a second photocurable material, which is curable by light having a second wave length range which is different from said first wave length range, wherein the first wave length range partially overlaps the second wave length range, comprising the steps of:

(a) exposing the media sheet to light having the first wave length range, (b) stopping the exposure of the media to the light having the first wave length range; and (c) after an effective amount of time has passed to supply oxygen to the micro-capsules exposing the media sheet to light having the second wave length range.

2. The method according to claim 1 wherein said first and second color developing dye is a colorless dye of which color is developed by reacting with a developer.

3. A method for forming latent images on a media sheet which is coated with at least first micro-capsules which contain a first photocurable material, which is curable by light having a first wave length range, and a first color developing dye, and second micro-capsules which contain a second photocurable material, which is curable by light having a second wave length range which is different from said first wave length range, and a second color developing dye, wherein the first wave length range partially overlaps the second wave length range, comprising the steps of:

(a) exposing the media sheet to light having a first wave length range, (b) finishing the first exposure, and (c) after 0.5 seconds or more from finishing the first exposure, exposing the media sheet to light having the second wave length range.

4. The method according to claim 3 wherein the time in step (C) is 0.7 seconds.

5. A method for forming latent images on a media sheet which is coated with first micro-capsules which contain a first photocurable material, which is curable by light having a first wave length range, and a first color developing dye, second micro-capsules which contain a second photocurable material, which is curable by light having a second wave length range which is different from said first wave length range, and a second color developing dye, and third micro-capsules which contain a third photocurable material, which is curable by light having a third wave length range which is different from said first and second wave length ranges, and a third color developing dye wherein the first wave length range is partially overlapped with the second wave length range, the second wave length range is partially overlapped with the third wave length range, comprising the steps of:
(a) exposing the media sheet to light having the first wave length range,
(b) finishing the first exposure, (c) after 0.5 seconds or more from finishing the first exposure, exposing the media sheet to light having the second wave length range, and
(d) completing the second exposure, and after 0.5 seconds or more from finishing the second exposure, exposing the media to light having the third wave length range.

6. The method according to claim 5 wherein the light that has the first wave length is a red light, the light having the second wave length is a green light, the light having the third wave length is a blue light, the first developing dye develops cyan, the second color developing dye develops magenta, and the third color developing dye develops yellow.

* * * * *